(12) United States Patent
Choi et al.

(10) Patent No.: US 8,765,572 B2
(45) Date of Patent: Jul. 1, 2014

(54) METHOD OF FABRICATING SEMICONDUCTOR DEVICE

(75) Inventors: Yong-lack Choi, Seoul (KR); Chang-hyun Cho, Yongin-si (KR); Seung-pil Chung, Seoul (KR); Hyun-seok Jang, Seoul (KR); Du-heon Song, Seongnam-si (KR); Jung-dal Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 13/168,312

(22) Filed: Jun. 24, 2011

(65) Prior Publication Data

US 2011/0318914 A1      Dec. 29, 2011

(30) Foreign Application Priority Data

Jun. 25, 2010 (KR) .................. 10-2010-0060660

(51) Int. Cl.
*H01L 21/764* (2006.01)

(52) U.S. Cl.
USPC ............ 438/422; 438/257; 257/315; 257/390

(58) Field of Classification Search
CPC .............. H01L 21/764; H01L 21/7682; H01L 2221/1042; H01L 2221/1047
USPC ......... 438/201, 211, 257, 421, 422, 587, 588, 438/592, 593; 257/314, 315, 390
See application file for complete search history.

(56) References Cited

U.S. PATENT DOCUMENTS

| | | | | |
|---|---|---|---|---|
| 6,080,613 A | * | 6/2000 | Seo et al. | 438/238 |
| 6,133,096 A | * | 10/2000 | Su et al. | 438/264 |
| 7,682,904 B2 | | 3/2010 | Kim et al. | |
| 7,683,441 B2 | * | 3/2010 | Shin | 257/410 |
| 7,704,851 B2 | * | 4/2010 | Kim | 438/422 |
| 8,081,516 B2 | * | 12/2011 | Lee et al. | 365/185.18 |
| 2004/0058522 A1 | * | 3/2004 | Lee et al. | 438/618 |
| 2007/0096202 A1 | * | 5/2007 | Kang et al. | 257/324 |
| 2007/0184615 A1 | * | 8/2007 | Brazzelli et al. | 438/266 |
| 2008/0246075 A1 | * | 10/2008 | Matsuno | 438/587 |
| 2009/0023279 A1 | | 1/2009 | Kim et al. | |

FOREIGN PATENT DOCUMENTS

| | | |
|---|---|---|
| KR | 1020080000822 | 1/2008 |
| KR | 1020080086183 | 9/2008 |
| KR | 1020090008582 | 1/2009 |

* cited by examiner

*Primary Examiner* — Fernando L Toledo
*Assistant Examiner* — Byran Junge
(74) *Attorney, Agent, or Firm* — Onello & Mello, LLP

(57) ABSTRACT

A method of fabricating a semiconductor device, in which an interference effect between word lines is substantially reduced or eliminated, includes forming a plurality of gate patterns on a substrate; forming a first insulating layer between the gate patterns, the first insulating layer filling a region between the gate patterns; etching the first insulating layer to remove a portion of the first insulating layer to a predetermined depth; and forming a second insulating layer on the gate patterns and the first insulating layer. A low-dielectric-constant material is formed between the gate patterns.

19 Claims, 16 Drawing Sheets

METHOD OF FABRICATING SEMICONDUCTOR DEVICE

CROSS-REFERENCE TO RELATED APPLICATIONS

This application claims the benefit of Korean Patent Application No. 10-2010-0060660 filed on Jun. 25, 2010 in the Korean Intellectual Property Office, the entire contents of which are incorporated herein by reference.

BACKGROUND

The inventive concept relates to a method of fabricating a semiconductor device, and more particularly, to a method of fabricating a semiconductor device by which an interference effect between word lines is substantially reduced or eliminated.

As semiconductor devices have become increasingly highly integrated, a width of an insulation layer decreases. As a result, a distance or interval between adjacent word lines and a distance or interval between adjacent floating gates also decrease. As a result, an interference effect occurs between the word lines and the floating gates, deepening a cell threshold voltage (Vth) shift and thus degrading the reliability of the semiconductor device.

SUMMARY

The inventive concept provides a method of fabricating a semiconductor device, by which an interference effect between word lines is substantially reduced or eliminated.

According to an aspect of the inventive concept, there is provided a method of fabricating a semiconductor device, the method including forming a plurality of gate patterns on a substrate, forming a first insulating layer between the gate patterns, the first insulating layer filing a region between the gate patterns, etching the first insulating layer to remove a portion of the first insulating layer to a predetermined depth, and forming a second insulating layer on the gate patterns and the first insulating layer, in which a low-dielectric-constant material is formed between the gate patterns.

In some exemplary embodiments, the low-dielectric-constant material may be air in an air gap. The air gap may be formed during the forming of the second insulating layer, and the air gap may directly contact the second insulating layer.

In some exemplary embodiments, the low-dielectric-constant material may include a material selected from the group consisting of air, hydrogen silsesquioxane (HSQ), methyl silsesquioxane (MSQ), amorphous floro-carbon (a-C:F), SiOF, SiOC, porous $SiO_2$, and a combination thereof.

In some exemplary embodiments, each of the gate patterns may include at least a first conductive layer pattern and a second conductive layer pattern on the first conductive layer pattern, and the air gap may be formed between adjacent second conductive layer patterns of adjacent gate patterns.

In some exemplary embodiments, the air gap may be further formed between adjacent first conductive layer patterns of adjacent gate patterns.

In some exemplary embodiments, portions of the first insulating layer formed at sidewalls of the first conductive layer pattern may be spaced apart by a first distance defined by the air gap, and the method may further include etching the first insulating layer such that the portions of the first insulating layer formed at the sidewalls of the first conductive layer pattern are spaced apart by a second distance larger than the first distance.

In some exemplary embodiments, the air gap may directly contact the first conductive layer pattern.

In some exemplary embodiments, the method may further include, between the etching of the first insulating layer and the forming of the second insulating layer, forming a third insulating layer on sidewalls of the second conductive layer pattern and the first insulating layer and sequentially etching the third insulating layer and the first insulating layer.

In some exemplary embodiments, the method may further include, after the sequential etching of the third insulating layer and the first insulating layer, forming a fourth insulating layer on the first insulating layer and the sidewalls of the second conductive layer pattern, and sequentially etching the fourth insulating layer and the first insulating layer.

In some exemplary embodiments, the third insulating layer may have an etching selectivity with respect to the first insulating layer, the third insulating layer may include a center portion and a spacer positioned at both sides of the center portion, and the sequential etching of the third insulating layer and the first insulating layer may include etching the center portion of the third insulating layer and etching the first insulating layer using the spacer as a mask.

In some exemplary embodiments, the forming of the gate patterns may include sequentially forming a first conductive layer and a second conductive layer on the substrate, and forming the first conductive layer pattern and the second conductive layer pattern by patterning the second conductive layer and the first conductive layer.

In some exemplary embodiments, the method may further include forming a blocking insulating layer between the first conductive layer and the second conductive layer, in which the gate patterns are formed by patterning the second conductive layer, the blocking insulating layer, and the first conductive layer.

In some exemplary embodiments, the second conductive layer may be formed by depositing a plurality of layers made of a material selected from the group consisting of a polysilicon layer, a metal layer, a nitride of the metal layer, a silicide of the metal layer, and a combination thereof.

In some exemplary embodiments, the second insulating layer may have a low step coverage.

According to another aspect of the inventive concept, there is provided a method of fabricating a semiconductor device, the method including forming a plurality of gate patterns in a cell region and a peripheral region of a substrate, each of the gate patterns including at least a first conductive layer pattern and a second conductive layer pattern on the first conductive layer pattern, forming a first insulating layer between the gate patterns, the first insulating layer filling a region between the gate patterns, forming a mask layer on the gate patterns and the first insulating layer, removing a portion of the mask layer to pattern the mask layer, the portion of the mask layer being positioned on the first insulating layer formed in the cell region, etching the first insulating layer to remove a portion of the first insulating layer exposed by the mask layer, the portion of the first insulation layer being removed to a predetermined depth, and forming a second insulating layer on the gate patterns and the first insulating layer, in which a low-dielectric-constant material is formed between the second insulating layer and the first insulating layer.

In some exemplary embodiments, the low-dielectric-constant material may include a material selected from the group consisting of air in an air gap, hydrogen silsesquioxane (HSQ), methyl silsesquioxane (MSQ), amorphous floro-carbon (a-C:F), SiOF, SiOC, porous $SiO_2$, and a combination thereof.

In some exemplary embodiments, forming the mask layer may include forming a negative photoresist layer on the gate patterns and the first insulating layer.

In some exemplary embodiments, during the etching of the first insulating layer, a portion of the first insulating layer in the peripheral region may not be etched due to a portion of the mask layer formed in the peripheral region.

According to another aspect of the inventive concept, there is provided a method of fabricating a semiconductor device, the method including forming a plurality of gate patterns in a cell region and a peripheral region of a substrate, each of the gate patterns including at least a first conductive layer pattern and a second conductive layer pattern on the first conductive layer pattern, forming a first insulating layer which fills a region between the gate patterns, etching the first insulating layer to a predetermined depth, forming a third insulating layer at sidewalls of the second conductive layer pattern and the first insulating layer, sequentially etching the third insulating layer and the first insulating layer, and forming a second insulating layer on the gate patterns and the first insulating layer, in which an air gap is formed between the second insulating layer and the first insulating layer.

In some exemplary embodiments, the third insulating layer may have an etching selectivity to the first insulating layer, the third insulating layer may include a center portion and a spacer positioned at both sides of the center portion, and the sequential etching of the third insulating layer and the first insulating layer may include etching the center portion of the third insulating layer and etching the first insulating layer using the spacer as a mask.

According to another aspect of the inventive concept, there is provided a method of fabricating a semiconductor device, the method comprising: forming a plurality of gate patterns on a substrate, each gate pattern comprising at least a first conductive layer pattern and a second conductive layer pattern on the first conductive layer pattern; forming a first insulating layer filling a region between the gate patterns; etching the first insulating layer to a predetermined depth; forming a second insulating layer on the first insulating layer and sidewalls of the second conductive layer pattern, wherein the second insulating layer has an etching selectivity with respect to the first insulating layer, the second insulating layer comprising a center portion and a spacer positioned at both sides of the center portion; sequentially etching the second insulating layer and the first insulating layer; forming a third insulating layer on the gate patterns and the first insulating layer, wherein a low-dielectric-constant material is formed between adjacent second conductive layer patterns of adjacent gate patterns.

In some exemplary embodiments, the sequential etching of the second insulating layer and the first insulating layer comprises: etching the center portion of the second insulating layer; and etching the first insulating layer using the spacer as a mask.

In some exemplary embodiments, the low-dielectric-constant material comprises a material selected from the group consisting of air, hydrogen silsesquioxane (HSQ), methyl silsesquioxane (MSQ), amorphous floro-carbon (a-C:F), SiOF, SiOC, porous $SiO_2$, and a combination thereof.

In some exemplary embodiments, the second conductive layer is formed by depositing a plurality of layers made of a material selected from the group consisting of a polysilicon layer, a metal layer, a nitride of the metal layer, a silicide of the metal layer, and a combination thereof.

In some exemplary embodiments, the semiconductor device comprises a semiconductor memory device.

In some exemplary embodiments, the semiconductor device comprises a controller for controlling a semiconductor memory device.

BRIEF DESCRIPTION OF THE DRAWINGS

The foregoing and other features and advantages of the inventive concept will be apparent from the detailed description of preferred embodiments of the inventive concept contained herein, as illustrated in the accompanying drawings, in which like reference characters refer to the same parts or elements throughout the different views. The drawings are not necessarily to scale, emphasis instead being placed upon illustrating the principles of the inventive concept. In the drawings, the thickness of layers and regions may be exaggerated for clarity.

DETAILED DESCRIPTION OF THE EMBODIMENTS

Figure 1:
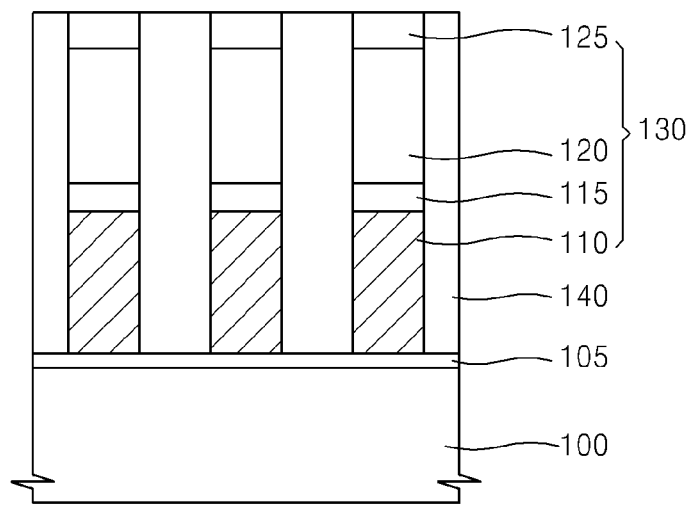
FIGS. 1 through 4 are schematic cross-sectional views illustrating a method of fabricating a semiconductor device according to an exemplary embodiment of the inventive concept.

Hereinafter, exemplary embodiments of the inventive concept will be described with reference to the accompanying drawings.

The terms used herein are for purposes of illustrating and describing the inventive concept only and should not be construed to limit the meaning or the scope of the inventive concept. As used in this specification, a singular form may, unless indicating a particular case in terms of the context, include a plural form. Also, the expressions "comprise" and/or "comprising" used in this specification neither define the mentioned shapes, numbers, steps, operations, members, elements, and/or groups of these, nor exclude the presence or addition of one or more other different shapes, numbers, steps, operations, members, elements, and/or groups of these, or addition of these. The term "and/or" used herein includes any and all combinations of one or more of the associated listed items.

As used herein, terms such as "first," "second," etc. are used to describe various members, components, regions, layers, and/or portions. However, it is obvious that the members, components, regions, layers, and/or portions should not be defined by these terms. The terms do not mean a particular order, up and down, or superiority, and are used only for distinguishing one member, component, region, layer, or portion from another member, component, region, layer, or portion. Thus, a first member, component, region, layer, or portion which will be described may also refer to a second member, component, region, layer, or portion, without departing from the scope of the inventive concept.

Hereinafter, exemplary embodiments of the inventive concept will be described with reference to the attached drawings which schematically illustrate the embodiments of the inventive concept. In the drawings, for example, according to the manufacturing technology and/or tolerance, variations from the illustrated shape may be expected. Thus, the exemplary embodiments of the inventive concept must not be interpreted to be limited by a particular shape that is illustrated in the drawings and must include a change in the shape occurring, for example, during manufacturing.

FIGS. 1 through 4 are schematic cross-sectional views illustrating a method of fabricating a semiconductor device according to some exemplary embodiments of the inventive concept.

Referring to FIG. 1, in some exemplary embodiments, a tunneling insulating layer 105 is formed on a substrate 100. The substrate 100 may be a semiconductor substrate, and may include, for example, one of silicon, a silicon-on-insulator, silicon-on-sapphire, germanium, silicon-germanium, and gallium-arsenide. In some exemplary embodiments, the tunneling insulating layer 105 may be formed by depositing a plurality of layers, each made of a material selected from the group consisting of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), zirconium oxide ($ZrO_2$), and a combination thereof.

Thereafter, in some exemplary embodiments, a plurality of gate patterns 130 is formed on the tunneling insulating layer 105. In some exemplary embodiments, each of the gate patterns 130 may include a first conductive layer pattern 110, a blocking insulating layer 115, a second conductive layer pattern 120, and a capping insulating layer 125, formed in a stacked configuration as illustrated in FIG. 1.

In some exemplary embodiments, the first conductive layer pattern 110 may include polysilicon doped with impurities. More specifically, in these exemplary embodiments, polysilicon may be deposited on the tunneling insulating layer 105 by, for example, chemical vapor deposition (CVD), e.g., low-pressure CVD (LPCVD) using $SiH_4$ or $Si_2H_6$ and $PH_3$ gas, and is doped with impurities, thus forming the first conductive layer pattern 110.

In some exemplary embodiments, the blocking insulating layer 115 may be structured such that a lower dielectric layer, a high-dielectric-constant layer, and an upper dielectric layer are sequentially formed on the first conductive layer pattern 110. For example, the lower dielectric layer and the upper dielectric layer may include silicon oxide layers. When the lower dielectric layer and the upper dielectric layer are silicon oxide layers, they may have the same material and internal structure as each other, and each may be a single layer including one or more of $SiO_2$, carbon-doped $SiO_2$, fluorine-doped $SiO_2$, or porous $SiO_2$. In some exemplary embodiments, the silicon oxide layers may be, for example, high temperature oxide (HTO) layers formed by high-temperature oxidation using $SiH_2Cl_2$ and $H_2O$ gases having superior pressure-resistance and time dependent dielectric breakdown (TDDB) characteristics as source gases. However, this is merely an illustrative example, and the inventive concept is not limited to this example.

In some exemplary embodiments, the high-dielectric-constant layer may be or may include a silicon nitride layer or a metal oxide layer having a higher dielectric constant than that of the silicon nitride layer. The metal oxide layer may be formed, for example, by depositing a plurality of layers made of a material selected from the group consisting of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide (LaAlO), lanthanum hafnium oxide (LaHfO), hafnium aluminum oxide (HfAlO), praseodymium oxide ($Pr_2O_3$), and/or a combination thereof In some exemplary embodiments, the second conductive layer pattern 120 may include at least one of impurity-doped polysilicon, metal, metal nitride, metal silicide, and a combination thereof. More specifically, in some exemplary embodiments, the second conductive layer pattern 120 may be formed by depositing a plurality of layers made of a material selected from the group consisting of a polysilicon layer, a metal layer composed of aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Te), titanium (Ti), tungsten (W), zinc (Zn), or zirconium (Zr), a nitride thereof, a silicide thereof, and a combination thereof. However, layered structure and material of the second conductive layer pattern 120 are merely examples and the inventive concept is not limited to these examples.

In some exemplary embodiments, a first insulating layer 140 is formed between the gate patterns 130. The first insulating layer 140 may be formed of a material having an etching selectivity with respect to the capping insulating layer 125. For example, the capping insulating layer 125 may be made of silicon nitride, and the first insulating layer 140 may be made of silicon oxide having an etching selectivity with respect to the capping insulating layer 125.

Figure 2:
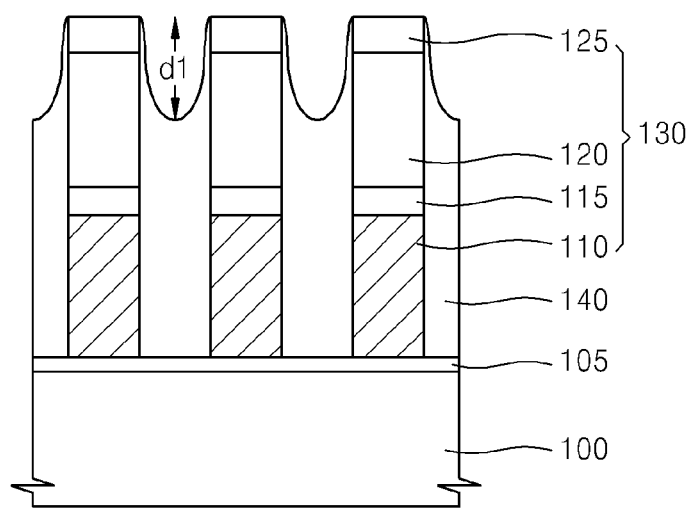

Referring to FIG. 2, in some exemplary embodiments, the first insulating layer 140 is etched between gate patterns 130 to a predetermined depth d1 defined perpendicular to the substrate 100. A recess etched to the predetermined depth d1 may be positioned at a depth that is within the second conductive layer pattern 120. That is, in some exemplary embodiments, the predetermined depth d1 may be smaller than a thickness of the second conductive layer pattern 120. More specifically, in each gate pattern 130 including the capping insulating layer 125 and the second conductive layer pattern 120, the predetermined depth d1 may be smaller than a sum of a thickness of the capping insulating layer 125 and the thickness of the second conductive layer pattern 120. Thus, an air gap (160 of FIG. 3) may be formed between adjacent second conductive layer patterns 120.

Figure 3:
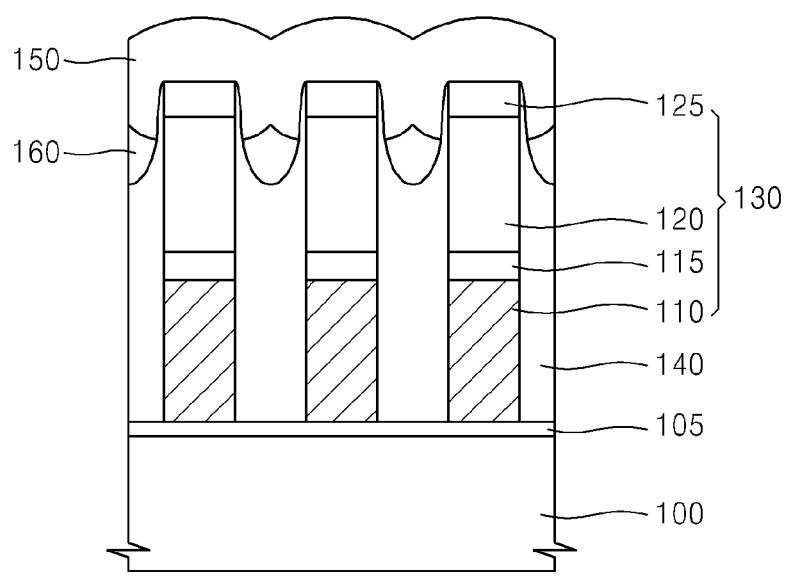

Referring to FIG. 3, a second insulating layer 150 is formed on the gate patterns 130 and the first insulating layer 140. In this case, the air gap 160 may be formed or captured between the first insulating layer 140 and the second insulating layer

150. In some exemplary embodiments, to form the air gap 160 smoothly by means of deposition of the second insulating layer 150, the second insulating layer 150 may be formed of a material having a low step coverage. In some exemplary embodiments, the material may be, for example, tetra ortho silicate glass (O3-TEOS) or undoped silicate glass (USG). The deposition speed of the second insulating layer 150 and bias power and direction may be adjusted so that the second insulating layer 150 may have a low step coverage.

In some exemplary embodiments, a low-dielectric-constant material, instead of the air gap 160, may be formed between the first insulating layer 140 and the second insulating layer 150. In this case, the low-dielectric-constant material may be formed on the first insulating layer 140, and the second insulating layer 150 may be formed on the low-dielectric-constant material. The low-dielectric-constant material may be or may include a material selected from the group consisting of the air gap 160, hydrogen silsesquioxane (HSQ), methyl silsesquioxane (MSQ), amorphous floro-carbon (a-C:F), SiOF, SiOC, porous $SiO_2$, and a combination thereof.

Figure 4:
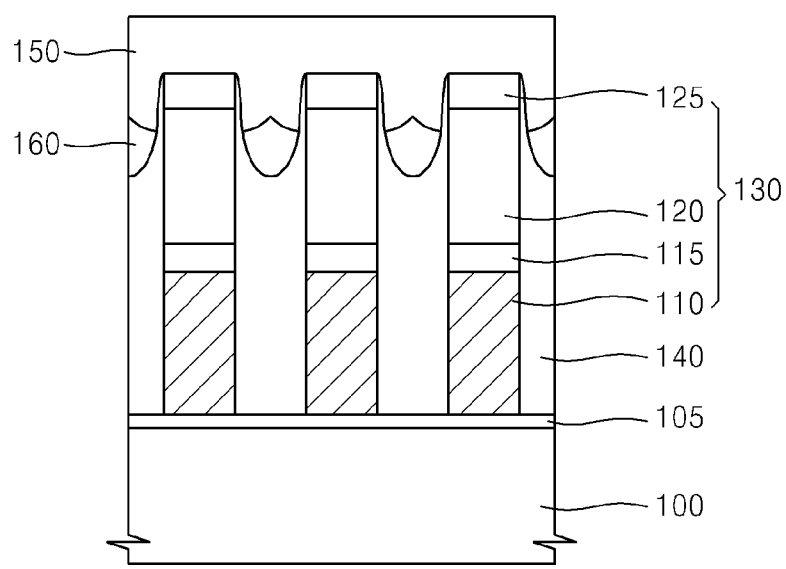

Referring to FIG. 4, in some exemplary embodiments, planarization is performed on the second insulating layer 150. The planarization may be performed using a chemical mechanical polishing (CMP) process, an etch-back process, or a combination of the CMP process and the etch-back process.

Figure 5:
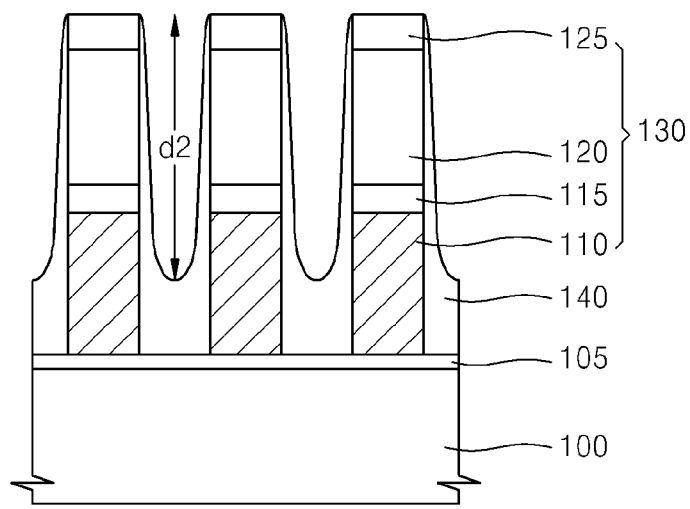
FIGS. 5 and 6 are schematic cross-sectional views illustrating a method of fabricating a semiconductor device according to another exemplary embodiment of the inventive concept.
Figure 6:
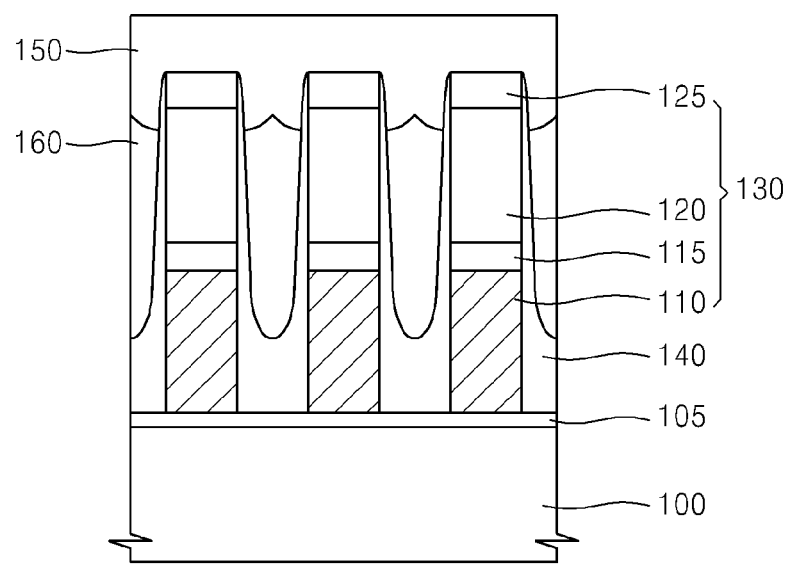

FIGS. 5 and 6 are schematic cross-sectional views illustrating a method of fabricating a semiconductor device according to some exemplary embodiments of the inventive concept. The method shown in FIGS. 5 and 6 is a partial modification of the method shown in FIGS. 1 through 4. Detailed description of like features and elements will not be repeated.

Referring to FIG. 5, in these exemplary embodiments, the first insulating layer 140 is etched to a predetermined depth d2 defined perpendicular to the substrate 100. A recess etched to the predetermined depth d2 may be positioned under the second conductive layer pattern 120 and on the first conductive layer pattern 110. That is, the predetermined depth d2 may be larger than the thickness of the second conductive layer pattern 120 and smaller than a sum of the thickness of the second conductive layer pattern 120 and the thickness of the first conductive layer pattern 110. More specifically, in these exemplary embodiments, in each gate pattern 130 including the capping insulating layer 125 and the second conductive layer pattern 120, the predetermined depth d2 may be larger than a sum of the thickness of the capping insulating layer 125 and the thickness of the second conductive layer pattern 120. The predetermined depth d2 may be smaller than a sum of the thickness of the capping insulating layer 125, the thickness of the second conductive layer pattern 120, and the thickness of the first conductive layer pattern 110.

Referring to FIG. 6, the second insulating layer 150 is formed on the gate patterns 130 and the first insulating layer 140, and is then planarized. Thus, the air gap 160 may be formed between adjacent second conductive layer patterns 120 and adjacent first conductive layer patterns 110.

FIGS. 7 through 12 are schematic cross-sectional views illustrating a method of fabricating a semiconductor device according to some exemplary embodiments of the inventive concept. The method shown in FIGS. 7 through 12 is a partial modification of the method shown in FIGS. 1 through 4. Detailed description of like features and elements will not be repeated.

Figure 7:
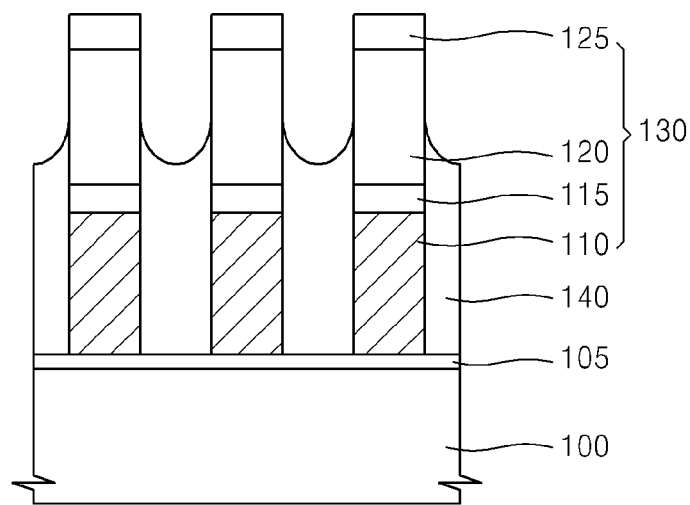
FIGS. 7 through 12 are schematic cross-sectional views illustrating a method of fabricating a semiconductor device according to another exemplary embodiment of the inventive concept.

Referring to FIG. 7, the first insulating layer 140 is etched to a predetermined depth defined perpendicular to the substrate 100. In these exemplary embodiments, the predetermined depth may be smaller than the thickness of the second conductive layer pattern 120. As previously described, in each gate pattern 130 including the capping insulating layer 125 and the second conductive layer pattern 120, the predetermined depth may be smaller than the sum of the thickness of the capping insulating layer 125 and the thickness of the second conductive layer pattern 120. By etching the first insulating layer 140, sidewalls of the capping insulating layer 125 and the second conductive layer pattern 120 may be exposed.

Figure 8:
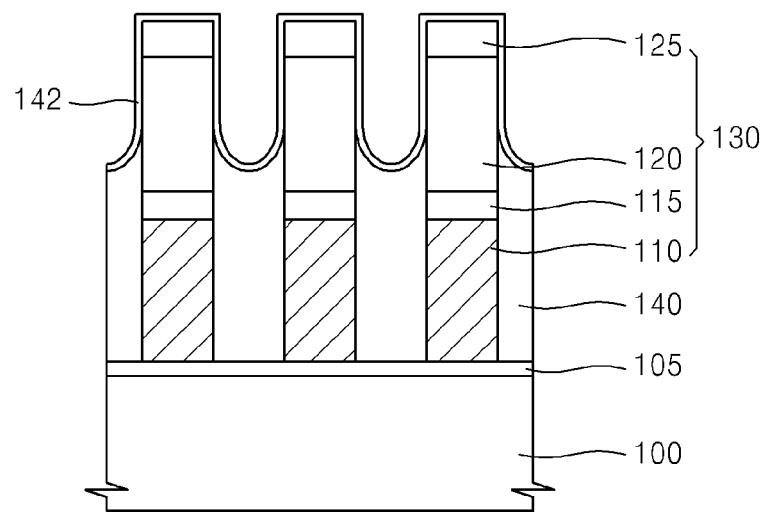
Figure 9:
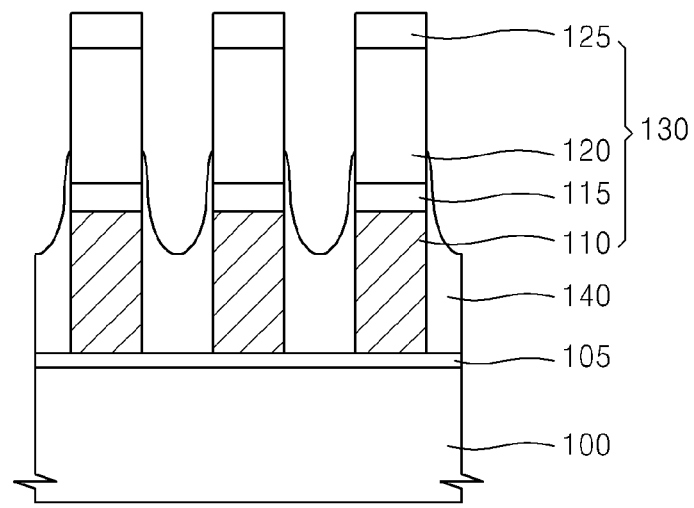

Referring to FIGS. 8 and 9, a third insulating layer 142 is formed on the first insulating layer 140. The third insulating layer 142 may be formed of a material having a superior step coverage. The material of the third insulating layer 142 may have the same etching selectivity as that of the first insulating layer 140. In some exemplary embodiments, the material may be, for example, a furnace-deposited oxide layer such as a HTO layer. By depositing the third insulating layer 142 having a superior step coverage, the third insulating layer 142 may be formed on the sidewalls of the second conductive layer pattern 120 and the sidewalls and top surface of the capping insulating layer 125. Thereafter, the third insulating layer 142 and the first insulating layer 140 are sequentially etched. As a result, a recess deeper than the recess formed to the predetermined depth by the previous etching may be formed, and damage of the second conductive layer pattern 120 may be prevented by the third insulating layer 142 during etching.

Figure 10:
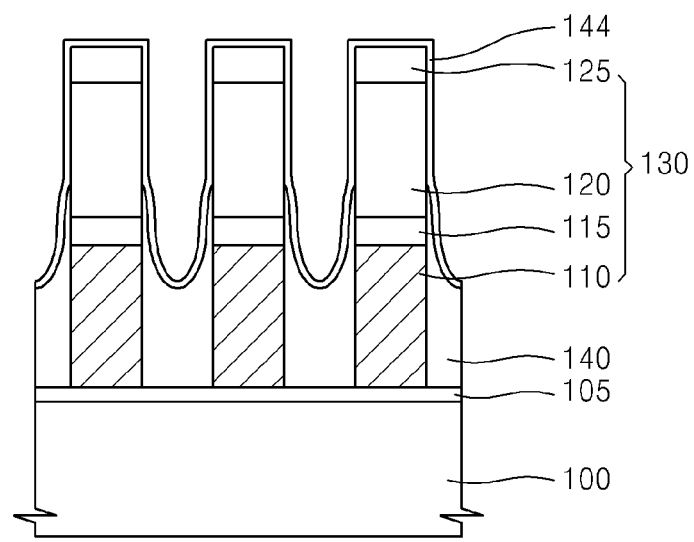
Figure 11:
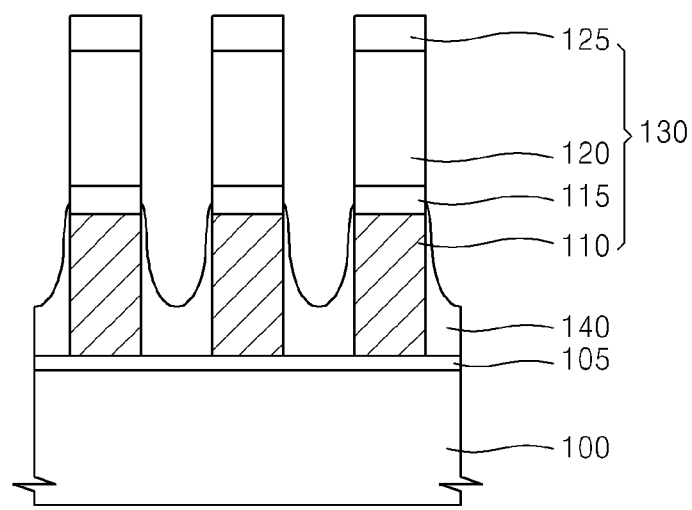

Referring to FIGS. 10 and 11, in some exemplary embodiments, to form a recess deeper than the recess formed by the etching shown in FIGS. 8 and 9, an additional etching process may be performed. The additional etching process is similar to the etching performed in FIGS. 8 and 9. That is, a fourth insulating layer 144 having a superior step coverage is formed on the first insulating layer 140, the sidewall of the second conductive layer pattern 120, and the sidewall of the capping insulating layer 125, and the fourth insulating layer 144 and the first insulating layer 140 are sequentially etched.

Figure 12:
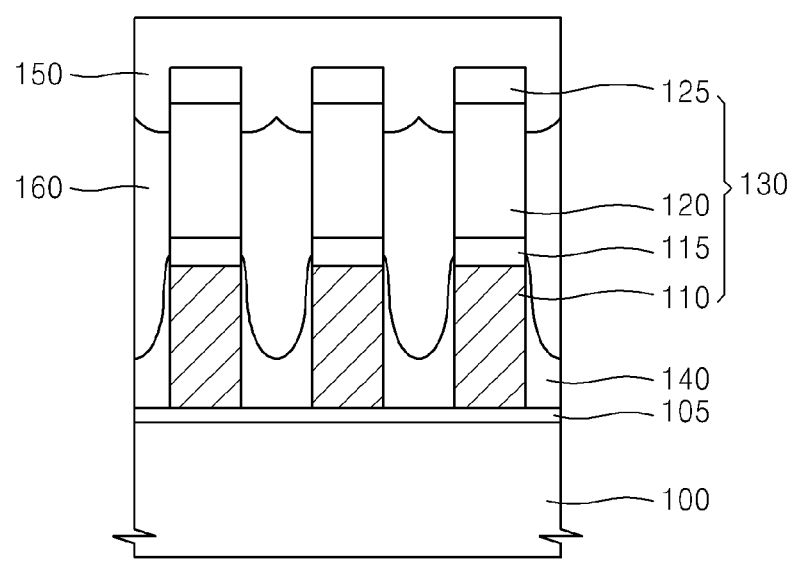

Referring to FIG. 12, the second insulating layer 150 is formed on the gate patterns 130 and the first insulating layer 140, and then is planarized. Thus, the air gap 160 may be formed between adjacent second conductive layer patterns 120 and between adjacent first conductive layer patterns 110, and the air gap 160 may directly contact the second conductive layer pattern 120.

Figure 13:
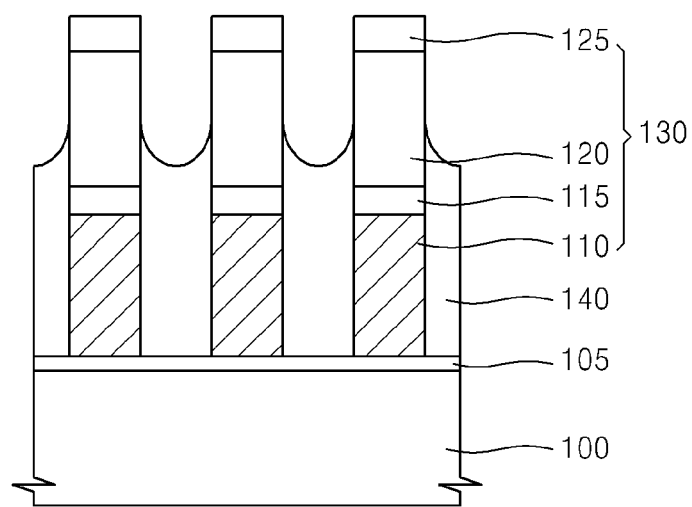
FIGS. 13 through 15 are schematic cross-sectional views illustrating a method of fabricating a semiconductor device according to another exemplary embodiment of the inventive concept.
Figure 14:
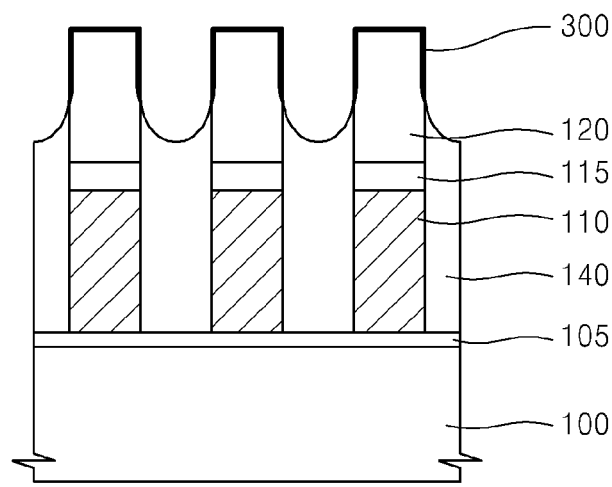
Figure 15:
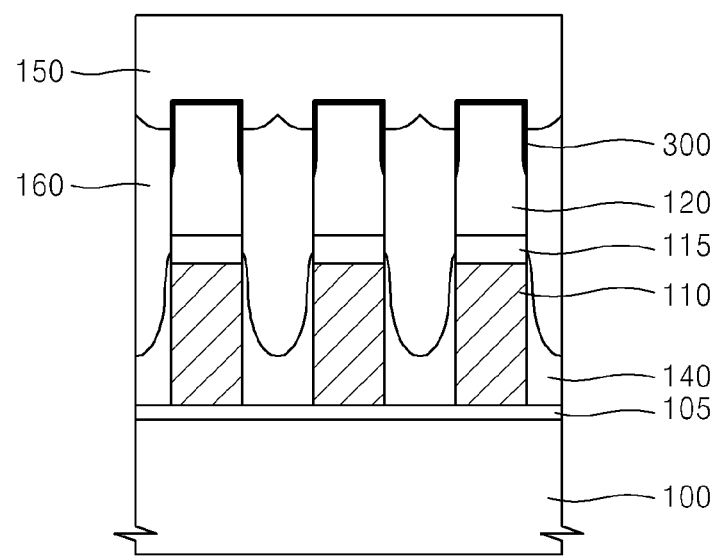

FIGS. 13 through 15 are schematic cross-sectional views illustrating a method of fabricating a semiconductor device according to some exemplary embodiments of the inventive concept. The method shown in FIGS. 13 through 15 is a partial modification of the method shown in FIGS. 7 through 12. Detailed description of like features and elements will not be repeated.

Referring to FIG. 13, the first insulating layer 140 is etched to a predetermined depth as shown in FIG. 7. As mentioned above, by etching the first insulating layer 140, the sidewalls of the capping insulating layer 125 and the second conductive layer pattern 120 may be exposed.

Referring to FIG. 14, the capping insulating layer 125 may be removed and silicidation is performed on the exposed second conductive layer pattern 120. For example, in some exemplary embodiments, for the silicidation, the second conductive layer pattern 120 may be formed of polysilicon on which refractory metal such as cobalt (Co) or titanium (Ti) is deposited. Thereafter, the refractory metal formed on the first insulating layer 140 is removed, and the refractory metal formed on the second conductive layer pattern 120 is thermally treated, thus forming a polycide 300 contacting the second conductive layer pattern 120. Through the silicidation, the resistance of the second conductive layer pattern 120 may be reduced.

Referring to FIG. 15, the air gap 160 is formed by performing a process similar to that shown in FIGS. 8 through 12. Since a process of forming the air gap 160 and a process of forming the polycide 300 may be consecutively performed, an interference effect between word lines may be improved and at the same time, the electric resistance of the word lines may be reduced.

FIGS. 16 through 24 are schematic cross-sectional views illustrating a method of fabricating a semiconductor device according to some exemplary embodiments of the inventive concept. The method shown in FIGS. 16 through 24 is a partial modification of the method shown in FIGS. 1 through 4. Detailed description of like features and elements will not be repeated.

Figure 16:
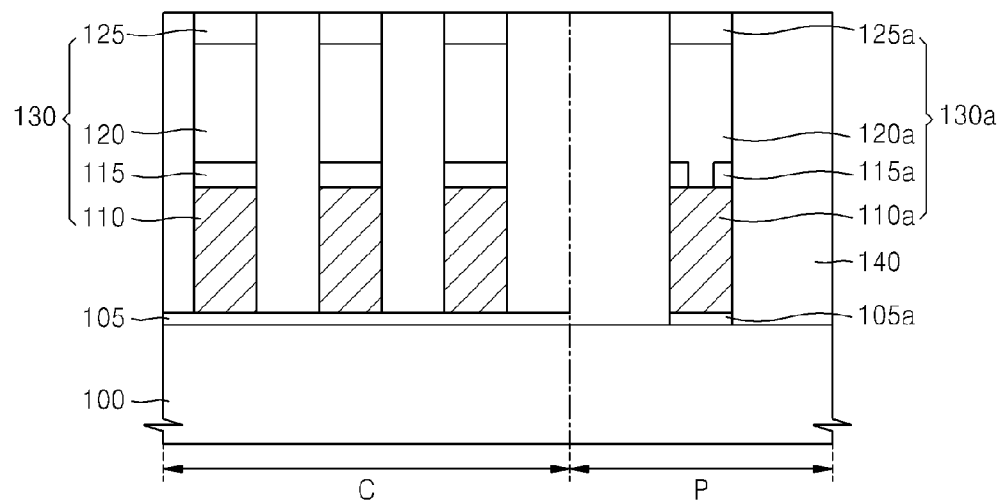
FIGS. 16 through 24 are schematic cross-sectional views illustrating a method of fabricating a semiconductor device according to another exemplary embodiment of the inventive concept.

Referring to FIG. 16, in some exemplary embodiments, the plurality of gate patterns 130 is formed in a cell region C, and at least one gate pattern 130a is formed in a peripheral region P. As described above, in some exemplary embodiments, each of the gate patterns 130 in the cell region C may include at least the first conductive layer pattern 110, the blocking insulating layer 115, the second conductive layer pattern 120, and the capping insulating layer 125, and the gate pattern 130a in the peripheral region P may include at least the first conductive layer pattern 110a, the blocking insulating layer 115a, the second conductive layer pattern 120a, and the capping insulating layer 125a. In each gate pattern 130 in the cell region C, the first conductive layer pattern 110 may be electrically separated from the second conductive layer pattern 120 by the blocking insulating layer 115 so that the gate pattern 130 may operate as a flash memory cell. In the gate pattern 130a on the peripheral region P, the first conductive layer pattern 110a may be electrically connected to, rather than being electrically separated from, the second conductive layer pattern 120a by the blocking insulating layer 115a.

Figure 17:
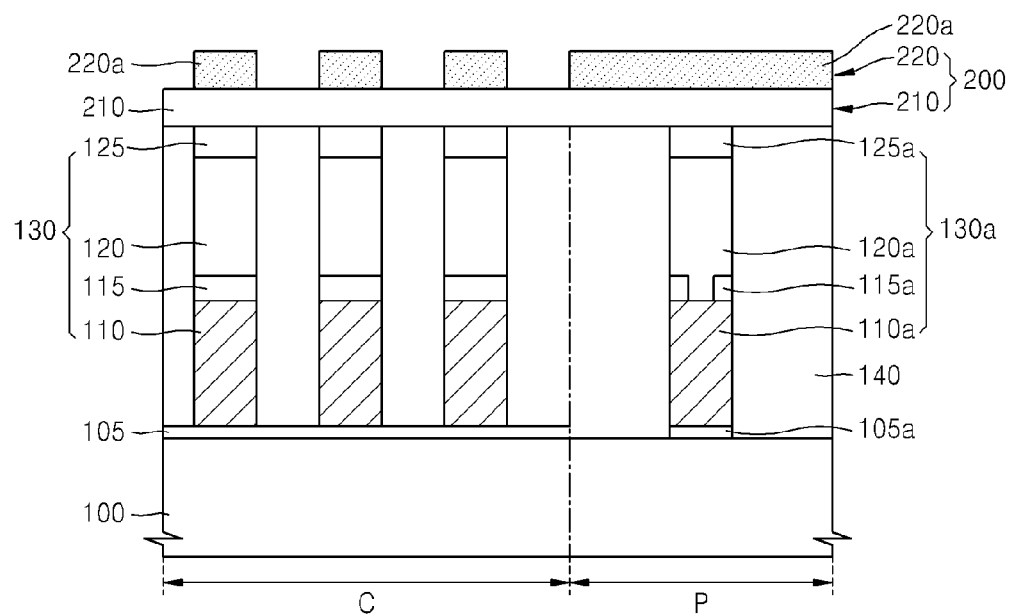
Figure 18:
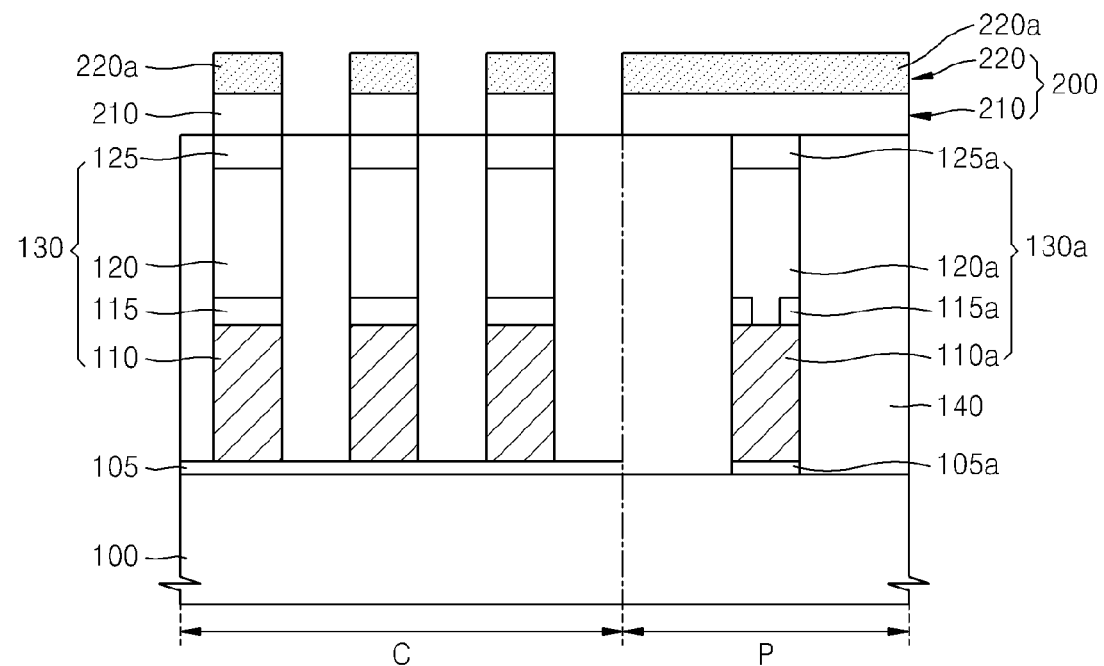

Referring to FIGS. 17 and 18, in some exemplary embodiments, a mask layer 200 is formed on the first insulating layer 140 and the capping insulating layer 125 (and the capping insulating layer 125a) in the cell region C and the peripheral region P. The mask layer 200 may include a mask insulating layer 210 and a photoresist layer 220 formed on the mask insulating layer 210.

Thereafter, the photoresist layer 220 in the cell region C is exposed to light and developed, thus forming a photoresist pattern 220a on the mask insulating layer 210. The photoresist pattern 220a may be formed to selectively cover the mask insulating layer 210 in correspondence with the capping insulating layer 125. In addition, the photoresist pattern 220a may be formed to cover the mask insulting layer 210 corresponding to the peripheral region P. The mask insulating layer 210 is then selectively etched using the photoresist pattern 220a as an etch mask. The mask layer 200 disposed on the first insulating layer 140 in the cell region C is removed, such that the first insulating layer 140 may be exposed by the mask layer 200.

Figure 19:
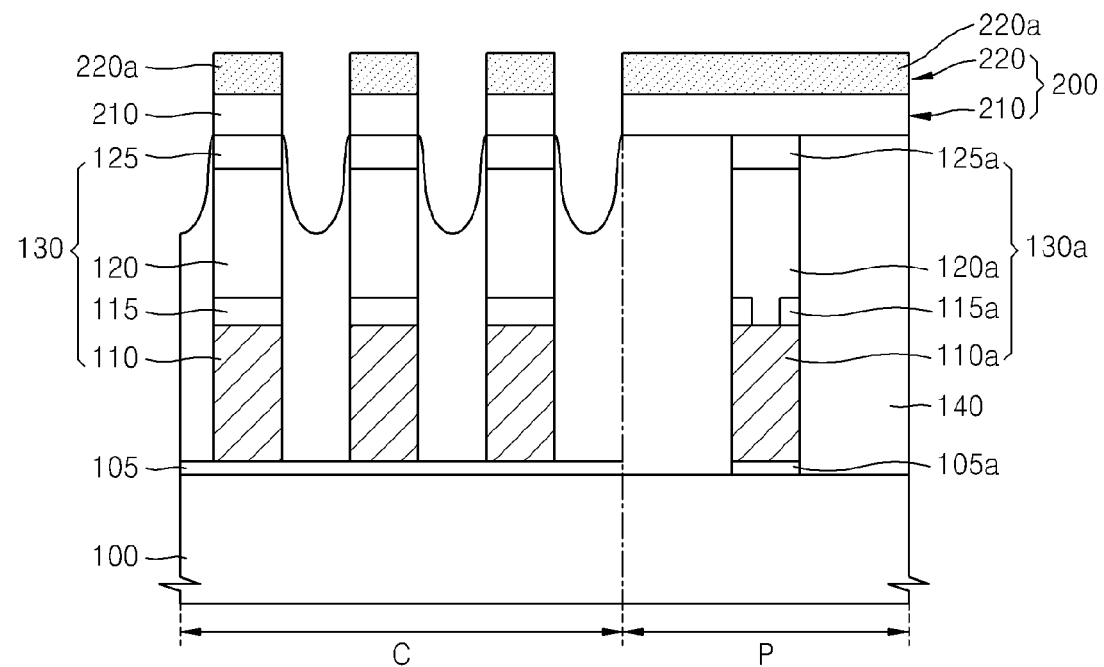

Referring to FIG. 19, the first insulating layer 140 exposed by the mask layer 200 is etched to a predetermined depth. The mask layer 200 may function as an etch mask for etching the first insulating layer 140. In some exemplary embodiments, the mask layer 200 formed in the peripheral region P may not be removed, and thus the gate pattern 130a and the first insulating layer 140 in the peripheral region P may not be affected by the etching process. That is, in this case, the etching process and subsequent etching processes affect the first insulating layer 140 in the cell region C.

In some exemplary embodiments, the photoresist layer 220 included in the mask layer 200 may be a negative photoresist layer in which a structure of a light-irradiated region is reinforced and thus a portion that has not been exposed to light is removed during development. With the negative photoresist layer 220, a uniform recess feature may be obtained during etching of the first insulating layer 140.

Figure 20:
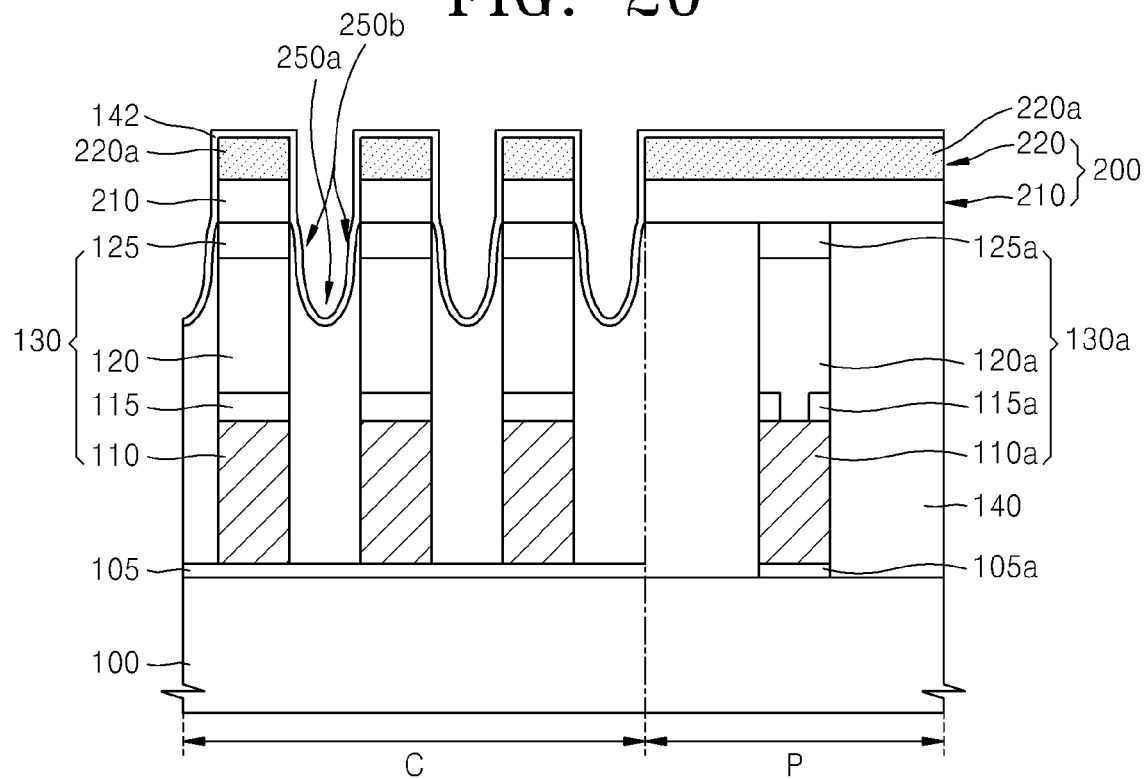
Figure 21:
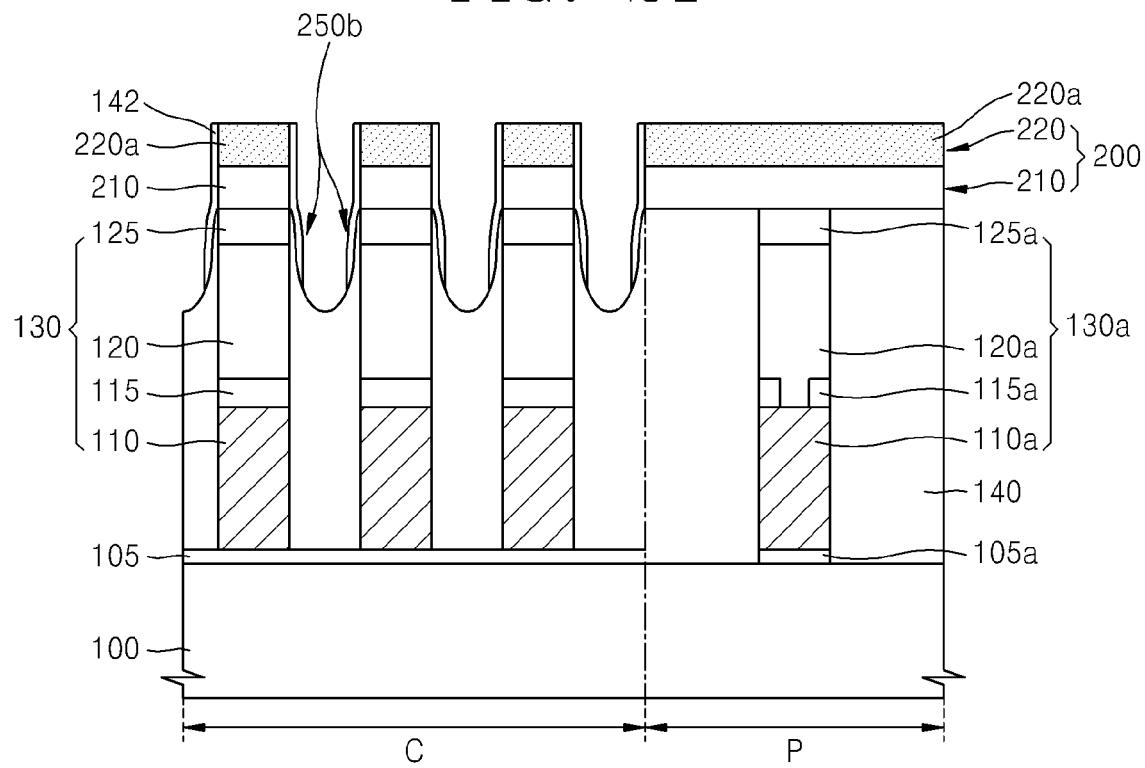
Figure 22:
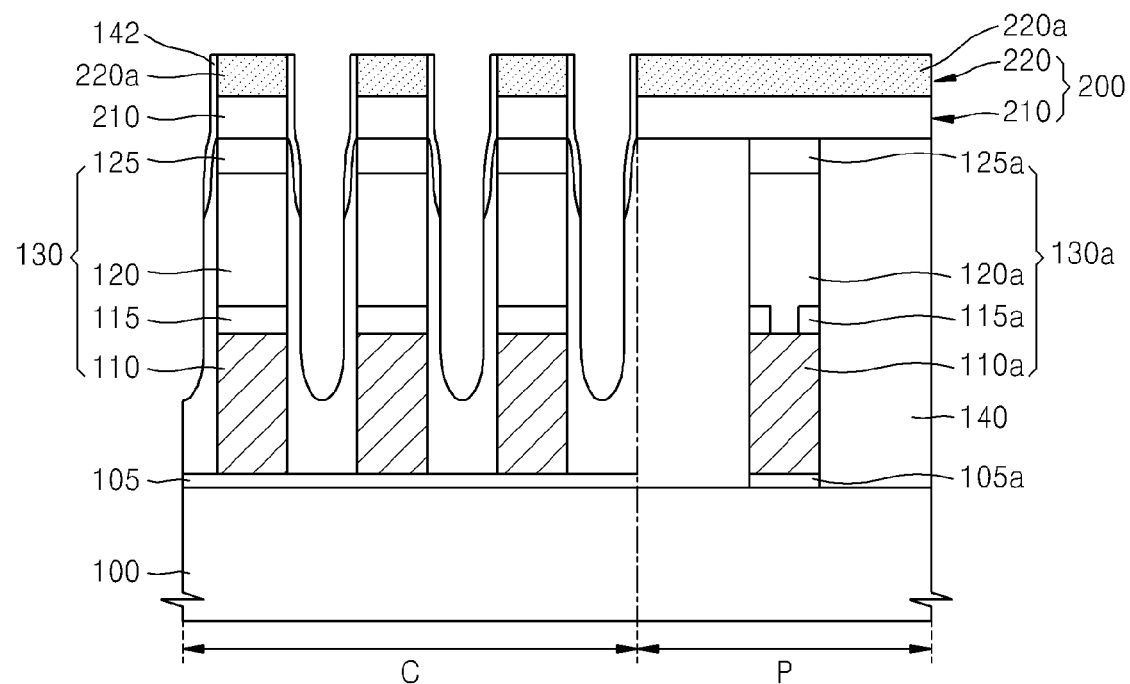

Referring to FIGS. 20 through 22, in some exemplary embodiments, the third insulating layer 142 is formed on the first insulating layer 140. The third insulating layer 142 may be formed of a material having an excellent step coverage. In some exemplary embodiments, the material may be, for example, a furnace-deposited oxide layer such as a HTO layer. As in the embodiments illustrated in FIGS. 7 through 12, the material of the third insulating layer 142 may have the same etching selectivity as that of the first insulating layer 140. The third insulating layer 142 and the first insulating layer 140 are then sequentially etched. Thus, a recess deeper than the recess formed to the predetermined depth by the previous etching process may be formed.

In some exemplary embodiments, the material of the third insulating layer 142 may have an etching selectivity different from that of the first insulating layer 140. In this case, the third insulating layer 142 may function as an etching mask for etching the first insulating layer 140. The third insulating layer 142 may include a center portion 250a and a spacer 250b at both sides of the center portion 250a. To etch the first insulating layer 140, the center portion 250a of the third insulating layer 142 is etched. In some exemplary embodiments, anisotropic etching may be applied to the third insulating layer 142 to etch only the center portion 250a without etching the spacer 250b. Thereafter, the first insulating layer 140 can be additionally etched using the spacer 250b as a mask. According to the exemplary embodiments of the inventive concept, with the spacer 250b having an etching selectivity to the first insulating layer 140, the sidewalls of each gate pattern 130 are prevented from being damaged during etching of the first insulating layer 140.

Figure 23:
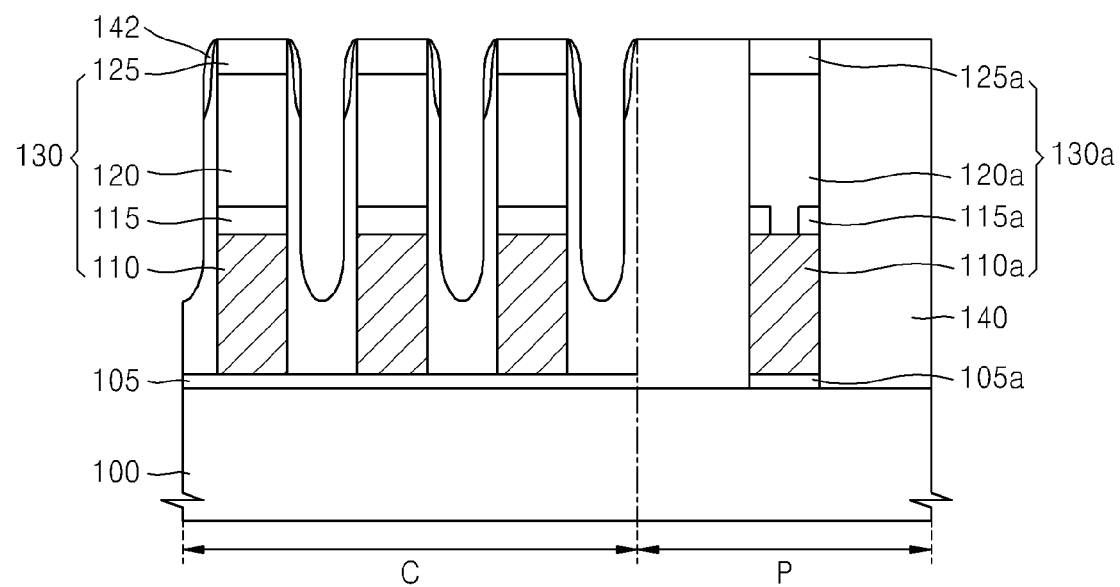
Figure 24:
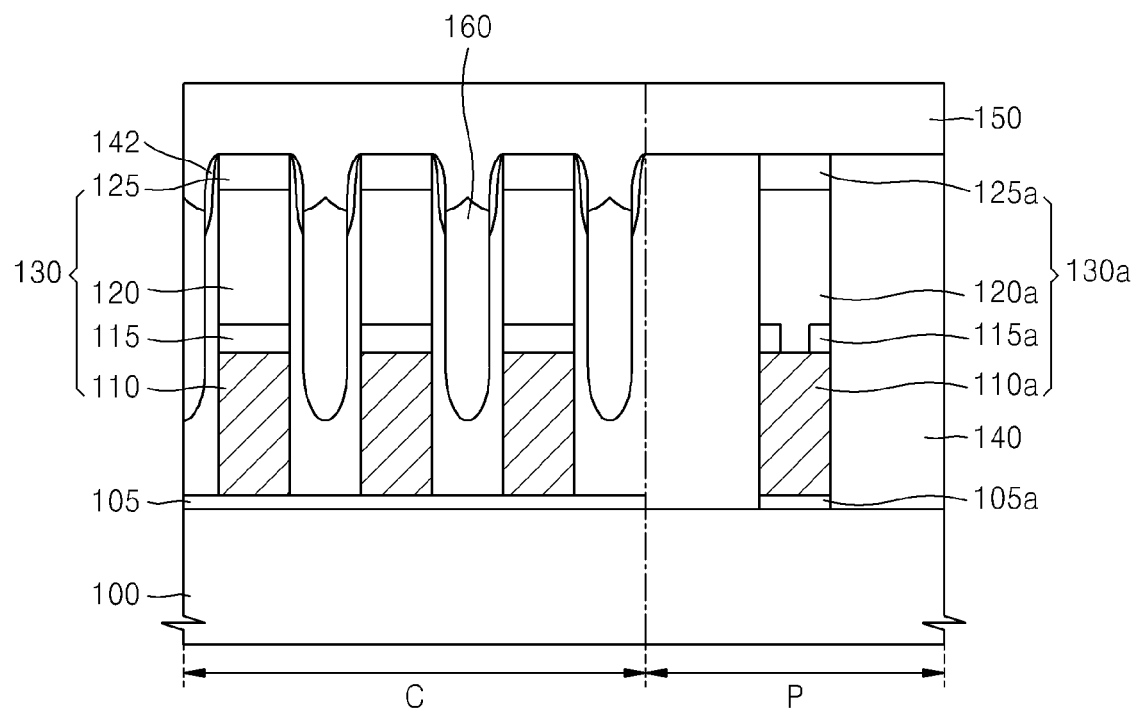

Referring to FIGS. 23 and 24, the mask layer 200 in the cell region C and the peripheral region P is removed through ashing and/or strip processes. Thereafter, the second insulating layer 150 having a low step coverage is formed on the gate patterns 130 and the gate pattern 130a and the first insulating layer 140. The second insulating layer 150 is then planarized. Thus, the air gap 160 is formed between the first insulating layer 140 and the second insulating layer 150. As described above, in some exemplary embodiments, other materials having low dielectric constants, instead of the air gap 160, may also be formed between the first insulating layer 140 and the second insulating layer 150.

Figure 25:
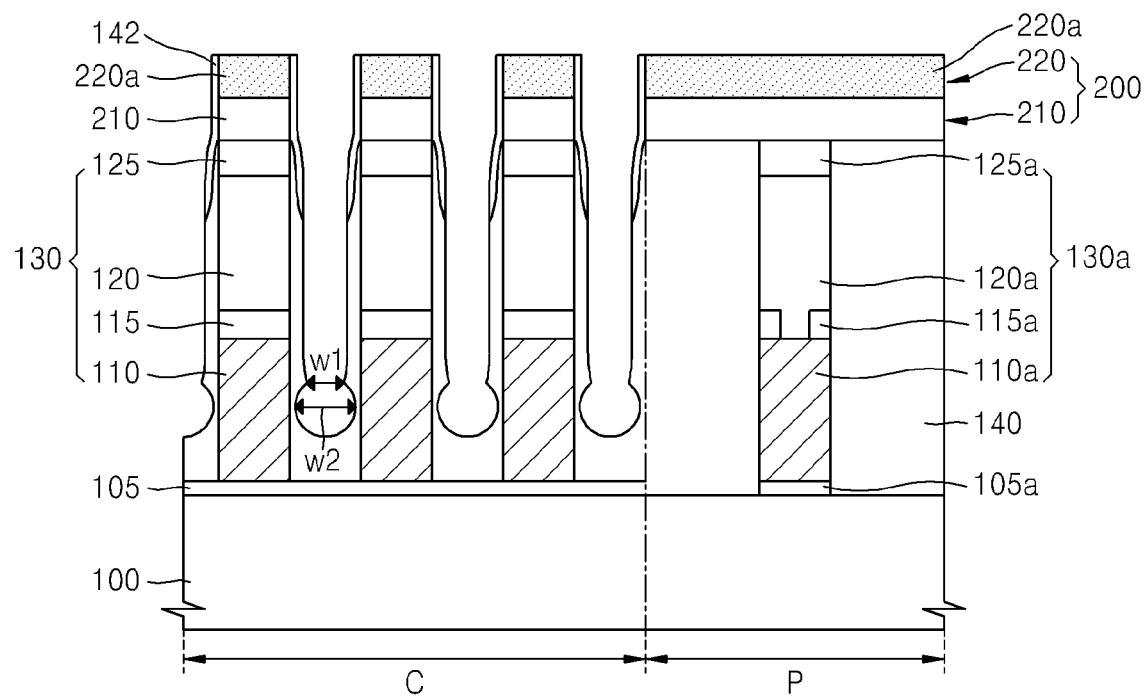
FIGS. 25 and 26 are schematic cross-sectional views illustrating a method of fabricating a semiconductor device according to another exemplary embodiment of the inventive concept.
Figure 26:
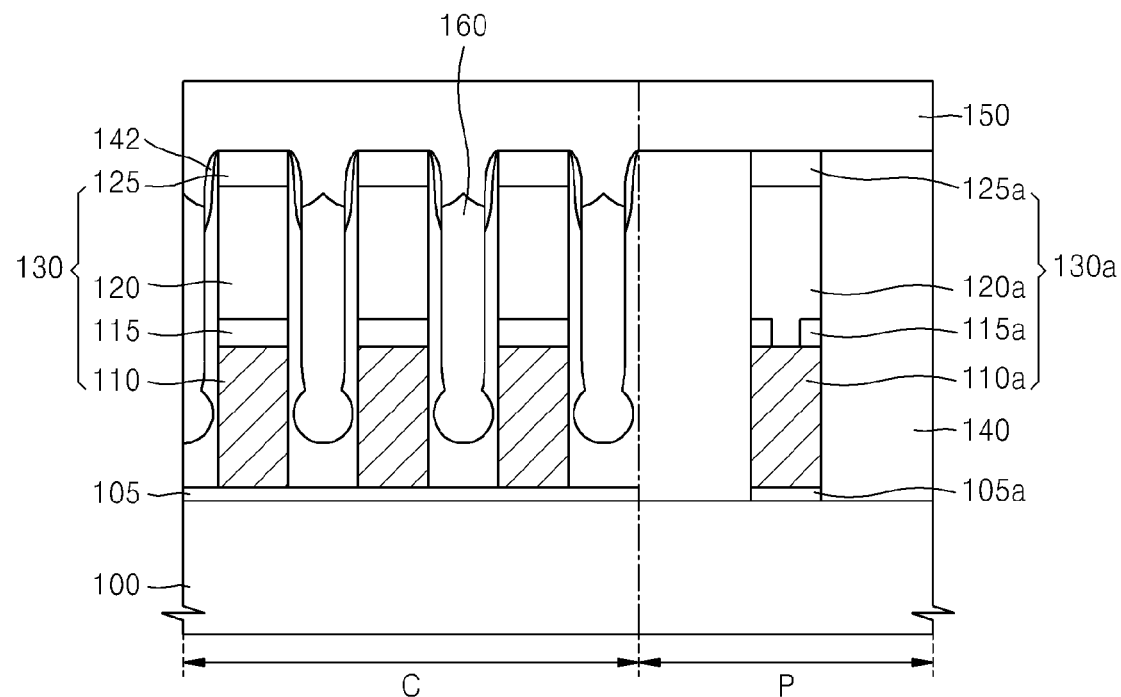

FIGS. 25 and 26 are schematic cross-sectional views illustrating a method of fabricating a semiconductor device according to some exemplary embodiments of the inventive concept. The method shown in FIGS. 25 and 26 is a partial modification of the method shown in FIGS. 13 through 21. Detailed description of like features and elements will not be repeated.

Referring to FIGS. 25 and 26, in some exemplary embodiments, before the ashing and/or strip processes are performed on the mask layer 200 in FIG. 20, a lower portion of the first insulating layer 140 in the cell region C can be additionally etched. If portions of the first insulating layer 140 formed at sidewalls of the first conductive layer pattern 110 are spaced apart by a first interval W1, additional etching of the lower portion of the first insulating layer 140 may result in their being spaced apart by a second interval W2, which is larger than the first interval W1. In some exemplary embodiments, the additional etching may be dry etching and/or wet etching.

Figure 27:
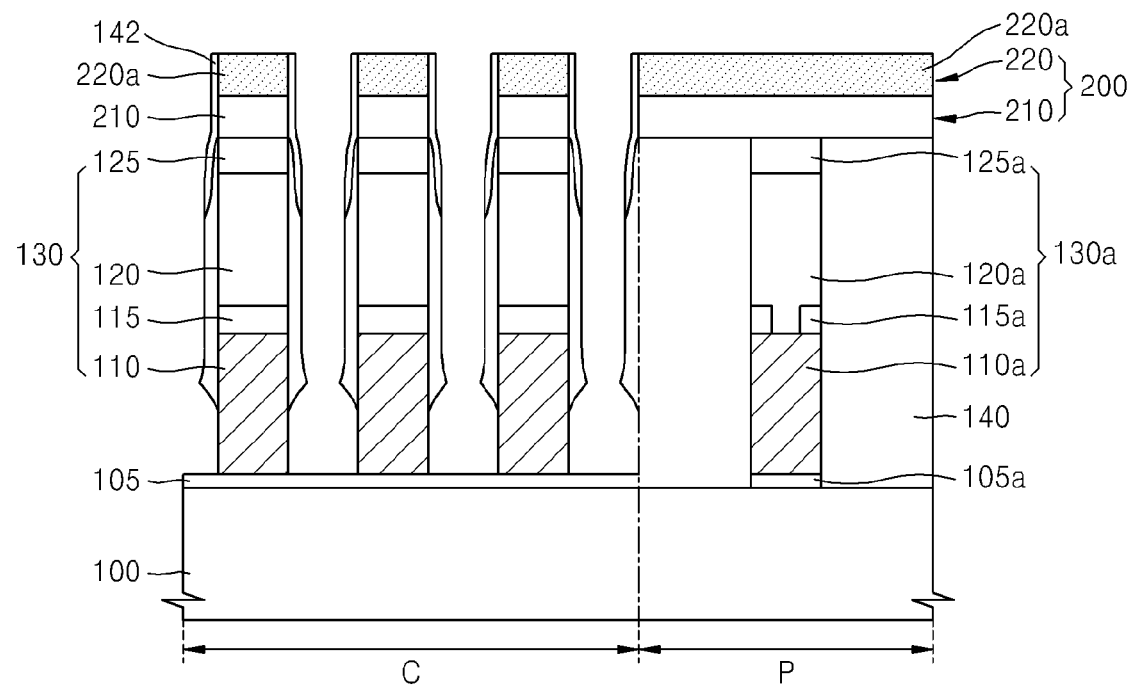
FIGS. 27 and 28 are schematic cross-sectional views illustrating a method of fabricating a semiconductor device according to another exemplary embodiment of the inventive concept.
Figure 28:
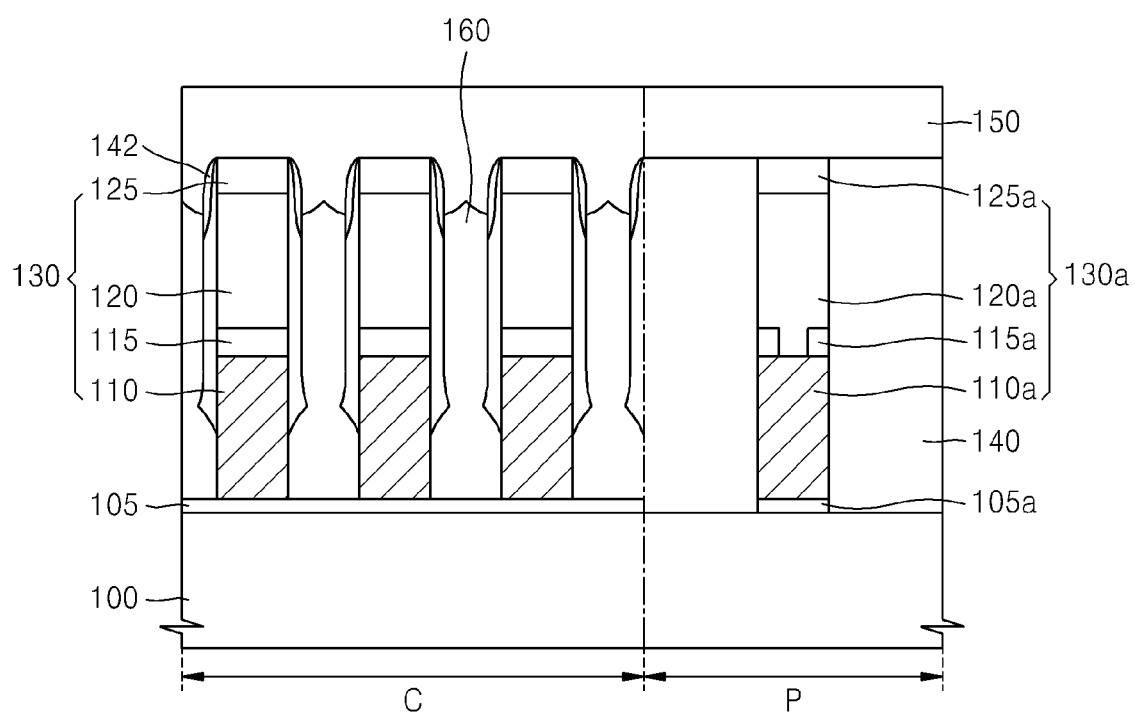

FIGS. 27 and 28 are schematic cross-sectional views illustrating a method of fabricating a semiconductor device according to some exemplary embodiments of the inventive concept. The method shown in FIGS. 27 and 28 is a partial modification of the method shown in FIGS. 22 and 23. Detailed description of like features and elements will not be repeated.

Referring to FIGS. 27 and 28, the lower portion of the first insulating layer 140 is further etched, such that the first insulating layer 140 at the sidewalls of the first conductive layer pattern 110 is removed. As a result, the first conductive layer pattern 110 is exposed. In this case, the air gap 160 formed between the first insulating layer 140 and the second insulating layer 150 may directly contact the first conductive layer pattern 110.

Figure 29:
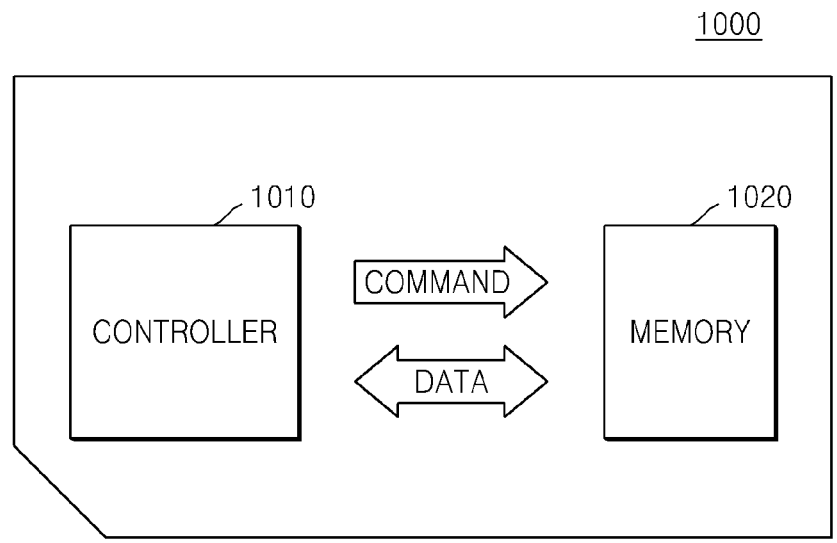
FIG. 29 is a schematic block diagram illustrating a card including a semiconductor device fabricated by a method of fabricating a semiconductor device according to an exemplary embodiment of the inventive concept.

FIG. 29 is a schematic block diagram illustrating a card 1000 including a semiconductor device fabricated by a method of fabricating a semiconductor device according to some exemplary embodiments of the inventive concept.

Referring to FIG. 29, in some exemplary embodiments, the card 1000 may include a controller 1010 and a memory 1020. The controller 1010 and the memory 1020 may be disposed to exchange electric signals. For example, when the controller 1010 issues a command, the memory 1020 may transmit data to the controller 1010 in response to the command. The memory 1020 may include a semiconductor device fabricated by a method of fabricating a semiconductor device according to one of the exemplary embodiments of the inventive concept described herein in detail. In some exemplary embodiments, the semiconductor device may be disposed in a "NAND" or "NOR" architecture memory array corresponding to logic gate design. In some exemplary embodiments, the memory array is composed of a plurality of rows and a plurality of columns which constitute one or more memory array banks. The memory 1020 may include such a memory array or a memory array bank. To drive the memory array bank, the card 1000 may further include a row decoder, a column decoder, input/output (I/O) buffers, and/or a control register. The card 1000 may be used in various types of card configurations, for example, a memory stick card, a smart media (SM) card, a secure digital (SD) card, a mini SD card, or a multimedia card (MMC).

Figure 30:
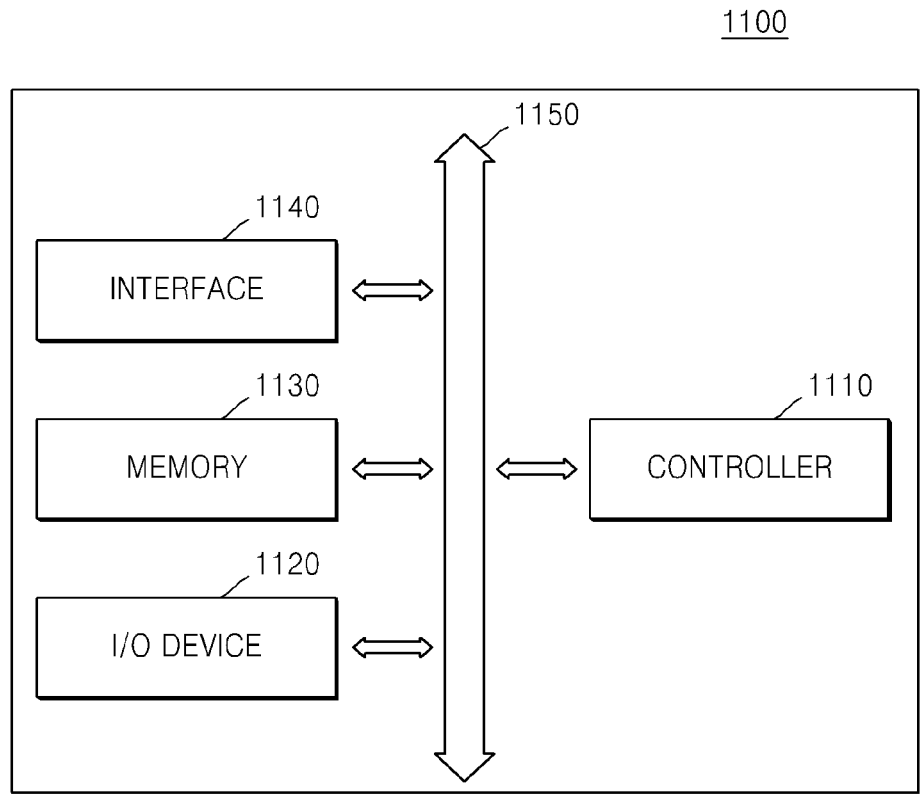
FIG. 30 is a schematic block diagram illustrating a system including a semiconductor device fabricated by a method of fabricating a semiconductor device according to an exemplary embodiment of the inventive concept.

FIG. 30 is a schematic block diagram illustrating a system 1100 including a semiconductor device fabricated by a method of fabricating a semiconductor device according to some exemplary embodiments of the inventive concept described herein in detail.

Referring to FIG. 30, in some exemplary embodiments, the system 1100 may include a controller 1110, an input/output (I/O) device 1120, a memory 1130, a memory 1130, and an interface 1140. The system 1100 may be, for example, a mobile system or a system for transmitting or receiving information. Examples of the mobile system may include a personal digital assistant (PDA), a portable computer, a web tablet, a wireless phone, a mobile phone, a digital music player, or a memory card. The controller 1110 may execute a program and control the system 1100. The controller 1110 may be, for example, a microprocessor, a digital signal processor (DSP), a microcontroller, or other similar device. The I/O device 1120 may be used to input or output data of the system 1100. In some exemplary embodiments, the system 1100 may be connected with an external device, e.g., a personal computer (PC) or a network, to exchange data with the external device by using the I/O device 1120. The I/O device 1120 may be, for example, a keypad, a keyboard, or a display device. The memory 1130 may store codes and/or data for operating the controller 1110, and/or store data processed by the controller 1110. The memory 1130 may include a semiconductor device fabricated by a method of fabricating a semiconductor device according to one of the exemplary embodiments of the inventive concept described herein in detail. The interface 1140 may be a data transmission path between the system 1100 and external devices. The controller 1110, the I/O device 1120, the memory 1130, and the interface 1140 may communicate with each other through a bus 1150. The system 1100 may be used, for example, for a mobile phone, an MP3 player, a navigation system, a portable multimedia player (PMP), a solid state disk (SSD), or household appliances.

While the inventive concept has been particularly shown and described with reference to exemplary embodiments thereof, it will be understood that various substitutions, modifications, and changes in form and details may be made therein without departing from the spirit and scope of the following claims.

What is claimed is:

1. A method of fabricating a semiconductor device, the method comprising:
    forming a plurality of gate patterns on a substrate;
    forming a first insulating layer between the gate patterns, the first insulating layer filling a region between the gate patterns;
    etching the first insulating layer to remove a portion of the first insulating layer to a predetermined depth, wherein portions of the first insulating layer formed at sidewalls of the gate patterns are spaced apart by a first distance;
    etching the first insulating layer such that the portions of the first insulating layer formed at the sidewalls of the gate patterns are spaced apart by a second distance larger than the first distance, wherein the etched portion of first insulating layer having the second spaced apart distance is closer to the substrate than the etched portion having the first spaced apart distance; and
    forming a second insulating layer on the gate patterns and the first insulating layer, wherein a low-dielectric-constant material is formed between the gate patterns.

2. The method of claim 1, wherein the low-dielectric-constant material is air in an air gap, the air gap being formed during the forming of the second insulating layer, the air gap directly contacting the second insulating layer.

3. The method of claim 1, wherein the low-dielectric-constant material comprises a material selected from the group consisting of air, hydrogen silsesquioxane (HSQ), methyl silsesquioxane (MSQ), amorphous floro-carbon (a-C:F), SiOF, SiOC, porous $SiO_2$, and a combination thereof.

4. The method of claim 2, wherein each of the gate patterns comprises at least a first conductive layer pattern and a second conductive layer pattern on the first conductive layer pattern, and
    the air gap is formed between adjacent second conductive layer patterns of adjacent gate patterns.

5. The method of claim 4, further comprising, between the etching of the first insulating layer and the forming of the second insulating layer, forming a third insulating layer on the first insulating layer and the sidewalls of the second conductive layer pattern, and sequentially etching the third insulating layer and the first insulating layer.

6. The method of claim 4, wherein the forming of the gate patterns comprises:

sequentially forming a first conductive layer and a second conductive layer on the substrate; and forming the first conductive layer pattern and the second conductive layer pattern by patterning the first conductive layer and the second conductive layer.

7. The method of claim 6, further comprising forming a blocking insulating layer between the first conductive layer and the second conductive layer, and wherein the gate patterns are formed by patterning the second conductive layer, the blocking insulating layer, and the first conductive layer.

8. The method of claim 6, wherein the second conductive layer is formed by depositing a plurality of layers made of a material selected from the group consisting of a polysilicon layer, a metal layer, a nitride of the metal layer, a silicide of the metal layer, and a combination thereof.

9. The method of claim 1, wherein the second insulating layer has a low step coverage.

10. A method of fabricating a semiconductor device, the method comprising:

forming a plurality of gate patterns on a substrate;

forming a first insulating layer between the gate patterns, the first insulating layer filling a region between the gate patterns;

etching the first insulating layer to remove a portion of the first insulating layer to a predetermined depth;

forming a third insulating layer on the first insulating layer;

sequentially etching of the third insulating layer and the first insulating layer;

forming a fourth insulating layer on the first insulating layer and the sidewalls of the gate patterns; and sequentially etching the fourth insulating layer and the first insulating layer; and forming a second insulating layer on the gate patterns and the first insulating layer, wherein a low-dielectric-constant material is formed between the gate patterns.

11. A method of fabricating a semiconductor device, the method comprising:

forming a plurality of gate patterns in a cell region and a peripheral region of a substrate, each of the gate patterns comprising at least a first conductive layer pattern and a second conductive layer pattern on the first conductive layer pattern;

forming a first insulating layer between the gate patterns, the first insulating layer filling a region between the gate patterns;

forming a mask layer on the gate patterns and the first insulating layer;

removing a portion of the mask layer to pattern the mask layer, the portion of the mask layer being positioned on the first insulating layer formed in the cell region;

etching the first insulating layer to remove a portion of the first insulating layer exposed by the mask layer, the portion of the first insulating layer being removed to a predetermined depth, wherein portions of the first insulating layer formed at sidewalls of the gate patterns are spaced apart by a first distance;

etching the first insulating layer such that the portions of the first insulating layer formed at the sidewalls of the gate patterns are spaced apart by a second distance larger than the first distance, wherein the etched portion of first insulating layer having the second spaced apart distance is closer to the substrate than the etched portion having the first spaced apart distance; and forming a second insulating layer on the gate patterns and the first insulating layer, wherein a low-dielectric-constant material is formed between the second insulating layer and the first insulating layer.

12. The method of claim 11, wherein the low-dielectric-constant material comprises a material selected from the group consisting of air in an air gap, hydrogen silsesquioxane (HSQ), methyl silsesquioxane (MSQ), amorphous floro-carbon (a-C:F), SiOF, SiOC, porous $SiO_2$, and a combination thereof.

13. The method of claim 11, wherein during the etching of the first insulating layer, a portion of the first insulating layer in the peripheral region is not etched due to a portion of the mask layer formed in the peripheral region.

14. A method of fabricating a semiconductor device, the method comprising:

forming a plurality of gate patterns on a substrate, each gate pattern comprising at least a first conductive layer pattern and a second conductive layer pattern on the first conductive layer pattern;

forming a first insulating layer filling a region between the gate patterns;

etching the first insulating layer to a predetermined depth, wherein portions of the first insulating layer formed at sidewalls of the gate patterns are spaced apart by a first distance;

forming a second insulating layer on the first insulating layer and sidewalls of the second conductive layer pattern, wherein the second insulating layer has an etching selectivity with respect to the first insulating layer, the second insulating layer comprising, a center portion and a spacer positioned at both sides of the center portion within a recess of the first insulating layer formed between the gate patterns;

sequentially etching the second insulating layer and the first insulating layer such that the portions of the first insulating layer formed at the sidewalls of the gate patterns are spaced apart by a second distance larger than the first distance;

forming a third insulating layer on the gate patterns and the first insulating layer, wherein a low-dielectric-constant material is formed between adjacent second conductive layer patterns of adjacent gate patterns.

15. The method of claim 14, wherein the sequential etching of the second insulating layer and the first insulating layer comprises:

etching the center portion of the second insulating layer; and etching the first insulating layer using the spacer as a mask to remove a portion of the first insulating layer.

16. The method of claim 14, wherein the low-dielectric-constant material comprises a material selected from the group consisting of air, hydrogen silsesquioxane (HSQ), methyl silsesquioxane (MSQ), amorphous floro-carbon (a-C:F), SiOF, SiOC, porous $SiO_2$, and a combination thereof.

17. The method of claim 14, wherein the second conductive layer is formed by depositing a plurality of layers made of a material selected from the group consisting of a polysilicon layer, a metal layer, a nitride of the metal layer, a silicide of the metal layer, and a combination thereof.

18. The method of claim 14, wherein the semiconductor device comprises a semiconductor memory device.

19. The method of claim 14, wherein the semiconductor device comprises a controller for controlling a semiconductor memory device.

* * * * *